United States Patent
Kim et al.

(10) Patent No.: US 11,023,078 B2
(45) Date of Patent: Jun. 1, 2021

(54) INPUTTER, DISPLAY APPARATUS HAVING THE SAME, AND CONTROL METHOD OF THE INPUTTER

(71) Applicant: SAMSUNG ELECTRONICS CO., LTD., Suwon-si (KR)

(72) Inventors: Shin A Kim, Seongnam-si (KR); Ho June Yoo, Seoul (KR); Sang Yoon Kim, Bucheon-si (KR); Eun Seo Kim, Gimpo-si (KR); Nam Su Ha, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/324,486

(22) PCT Filed: Jun. 15, 2017

(86) PCT No.: PCT/KR2017/006251
§ 371 (c)(1),
(2) Date: Feb. 8, 2019

(87) PCT Pub. No.: WO2018/030628
PCT Pub. Date: Feb. 15, 2018

(65) Prior Publication Data
US 2019/0179443 A1    Jun. 13, 2019

(30) Foreign Application Priority Data

Aug. 8, 2016   (KR) .......................... 10-2016-0100584

(51) Int. Cl.
*G06F 3/042*   (2006.01)
*G06F 3/041*   (2006.01)
(Continued)

(52) U.S. Cl.
CPC ................ *G06F 3/042* (2013.01); *G06F 3/03* (2013.01); *G06F 3/041* (2013.01); *G06F 3/0418* (2013.01);
(Continued)

(58) Field of Classification Search
CPC . G06F 3/042; G06F 3/03; G06F 3/041; G06F 3/0418; G06F 2203/04106;
(Continued)

(56) References Cited

U.S. PATENT DOCUMENTS 10,488,996 B2 *  11/2019  Rosenberg .............. G06F 3/044
2010/0060611 A1 *  3/2010  Nie ....................... G06F 1/3203
345/175

(Continued)

FOREIGN PATENT DOCUMENTS

FR   2 561 049 A1   9/1985
JP   2007-164282 A  6/2007
(Continued)

OTHER PUBLICATIONS

International Search Report (PCT/ISA/210) dated Sep. 22, 2017 issued by the International Searching Authority in International Application No. PCT/KR2017/006251.
(Continued)

*Primary Examiner* — Bryan Earles
(74) *Attorney, Agent, or Firm* — Sughrue Mion, PLLC

(57) ABSTRACT

A control method of an inputter comprises an operation in which at least one of the inputter and an electronic apparatus connected to the inputter acquires reference data, an operation in which a manipulation detector of the inputter outputs a manipulation detection signal, an operation in which a light source of the inputter irradiates a first light, an operation in which a light detector detects a first reflected light that is incident to the light detector among the irradiated first
(Continued)

light, and an operation in which at least one of the inputter and the electronic apparatus compares a detection result of the first reflected light and the reference data, and identifies whether the manipulation detector outputting the manipulation signal malfunctions, based on a comparison result.

13 Claims, 13 Drawing Sheets

(51) Int. Cl.
*G06F 3/03* (2006.01)
*H03K 17/96* (2006.01)
*H03K 17/945* (2006.01)
*H03K 17/94* (2006.01)

(52) U.S. Cl.
CPC ......... *H03K 17/941* (2013.01); *H03K 17/945* (2013.01); *H03K 17/96* (2013.01); *G06F 2203/04106* (2013.01); *H03K 2217/94026* (2013.01); *H03K 2217/94036* (2013.01); *H03K 2217/94108* (2013.01); *H03K 2217/94116* (2013.01); *H03K 2217/96031* (2013.01)

(58) Field of Classification Search
CPC .. G06F 3/03547; H03K 17/96; H03K 17/945; H03K 17/941; H03K 2217/94036; H03K 2217/96031; H03K 2217/94108; H03K 2217/94026; H03K 2217/94116
USPC ........................................................ 345/156
See application file for complete search history.

(56) References Cited

U.S. PATENT DOCUMENTS

| | | | |
|---|---|---|---|
| 2010/0171027 A1 | 7/2010 | Yun | |
| 2011/0180686 A1* | 7/2011 | Iwai | ......................... G01S 17/04 250/205 |
| 2013/0314365 A1 | 11/2013 | Woolley et al. | |
| 2014/0021331 A1* | 1/2014 | Chang | .................. H03K 17/941 250/206 |
| 2014/0110583 A1* | 4/2014 | Wu | ......................... G01S 7/493 250/340 |

FOREIGN PATENT DOCUMENTS

| | | |
|---|---|---|
| JP | 2010-286235 A | 12/2010 |
| KR | 10-2009-0006543 A | 1/2009 |
| KR | 10-2015-0002160 A | 1/2015 |
| WO | 2015/183285 A1 | 12/2015 |

OTHER PUBLICATIONS

Written Opinion (PCT/ISA/237) dated Sep. 22, 2017 issued by the International Searching Authority in International Application No. PCT/KR2017/006251.
Communication dated Jul. 12, 2019 issued by the European Intellectual Property Office in counterpart European Application No. 17839646.1.
Communication dated May 12, 2020 issued by the European Intellectual Property Office in counterpart European Application No. 17839646.1.
Communication dated Mar. 1, 2021 by the European Patent Office in corresponding European Application No. 17 839 646.1.

* cited by examiner

INPUTTER, DISPLAY APPARATUS HAVING THE SAME, AND CONTROL METHOD OF THE INPUTTER

TECHNICAL FIELD

The present disclosure relates to an inputter, a display apparatus having the inputter and a control method of the inputter.

BACKGROUND ART

In recent years, various devices such as electronic apparatuses and mechanical apparatuses have been provided with a user interface for receiving predetermined commands or providing a variety of information to a user. The user can allow the electronic apparatus and the mechanical apparatus to start its operation or to perform a predetermined operation by manipulating an input means of the user interface.

As for these various devices, the electronic apparatus may include a home appliance. Home appliances are a collection of various types of electronic products used at home. Home appliances include refrigerators, washing machines, televisions, radios, audio devices, vacuum cleaners, air conditioners, home computers or laptop computers. In home appliances, a control device for controlling various operations required for the home appliance can be embedded. For example, the control device may include a micro control unit (MCU). The micro control unit represents a controller corresponding to one or more chips in which a plurality of modules such as a central processing unit (CPU), a volatile or nonvolatile storage device, one or more ports are implemented. The MCU may perform various operations to generate a control signal, and control the entire home appliance by transmitting the generated control signal to each component of the home appliance.

DISCLOSURE

Technical Problem

The present disclosure is directed to providing an inputter capable of preventing a malfunction caused by an external noise and improving input precision, a display apparatus having the inputter, and a control method of the inputter.

Technical Solution

In order to solve the above-described problems, an inputter, a display apparatus having the inputter and a control method of the inputter are provided.

One aspect of the present disclosure provides a control method of an inputter including an operation in which at least one of the inputter and an electronic apparatus connected to the inputter acquires reference data, an operation in which a manipulation detector of the inputter outputs a manipulation detection signal, an operation in which a light source of the inputter irradiates a first light, an operation in which a light detector detects a first reflected light that is incident to the light detector among the irradiated first light, and an operation in which at least one of the inputter and the electronic apparatus compares a detection result of the first reflected light and the reference data, and identifies whether the manipulation detector outputting the manipulation signal malfunctions, based on a comparison result.

The acquisition of the reference data may include an operation in which the light source irradiates a second light, an operation in which the light detector detects a second reflected light caused by the irradiated second light, and an operation in which the reference data is acquired based on a detection result of the second reflected light.

The operation in which the light source irradiates the second light in response to the acquisition of the reference data may include an operation in which light source irradiates the second light periodically, and an operation in which light source irradiates the second light at a predetermined time or an operation in which light source irradiates the second light at an arbitrary time The operation in which the light source irradiates the light may include an operation in which the light source irradiates the light by a plurality of times, and the acquisition of the reference data based on the detection result of the reflected second light may include acquiring reference data based on a detection result of the plurality of second reflected light corresponding to the light irradiated by the plurality of times.

The comparison between the detection result of the first reflected light and the reference data and the identification of whether the manipulation detector outputting the manipulation signal malfunctions, based on a comparison result, may include identifying that, when a difference between the detection result of the first reflected light and the reference data is greater than a predetermined comparison value, the manipulation detector is operated normally.

The control method may further include generating a control signal corresponding to the manipulation detection signal, when the manipulation detector is operated normally.

The comparison between the detection result of the first reflected light and the reference data and the identification of whether the manipulation detector outputting the manipulation signal malfunctions, based on a comparison result, may include identifying that, when a difference between the detection result of the first reflected light and the reference data is less than a predetermined comparison value, the manipulation detector malfunctions.

The control method may further include ignoring the manipulation detection signal, when the manipulation detector malfunctions.

The manipulation detector may include at least one of a touch sensor or an infrared sensor.

The control method may further include identifying a position of an external object and correcting a detection result of the first reflected light based on the position of the external object.

Another aspect of the present disclosure provides a display apparatus including a substrate, a manipulation detector installed on the substrate and configured to output a manipulation detection signal in response to a user manipulation, a light source installed on the substrate or the manipulation detector and configured to irradiate light, a light detector configured to output a detection signal corresponding to a reflected light that is incident among the light irradiated from the light source; and a processor configured to compare the detection signal corresponding to the reflected light and reference data, and configured to identify whether the manipulation detector outputting the manipulation signal malfunctions, based on a comparison result.

When it is a time to acquire reference data, the processor may allow the light source to irradiate light and acquire the reference data based on a detection signal of the light detector.

The processor may acquire the reference data by allowing the light source to irradiate light periodically or to irradiate light at a predetermined time or at an arbitrary time.

The processor may allow the light source to irradiate light by a plurality of times, and acquire the reference data based on a plurality of detections signals corresponding to the light irradiated by the plurality of times.

When a difference between the detection signal of the reflected light and the reference data is greater than a predetermined comparison value, the processor may identify that the manipulation detector is operated normally, When the difference between the detection signal of the reflected light and the reference data is less than the predetermined comparison value, the processor may identify that the manipulation detector malfunctions.

The processor may ignore the manipulation detection signal, when the manipulation detector malfunctions.

The manipulation detector may include at least one of a touch sensor or an infrared sensor.

The display apparatus may further include an object position detector configured to detect a position of an external object. The processor may correct a detection result of the reflected light based on the position of the external object.

Another aspect of the present disclosure provides an inputter including a substrate, a manipulation detector installed on the substrate and configured to output a manipulation detection signal in response to a user manipulation, a light source installed on the substrate or the manipulation detector and configured to irradiate light, and a light detector configured to output a detection signal corresponding to a reflected light that is incident among the light irradiated from the light source. The manipulation detector transmits the output manipulation detection signal to a body according to a comparison result between the detections signal of the reflected light and the reference data.

Advantageous Effects

The inputter, the display apparatus in which the inputter is installed, and the control method of the inputter may prevent a malfunction caused by an external noise and improve input precision of the inputter.

MODES FOR THE INVENTION

Hereinafter various embodiments of an inputter and an electronic apparatus to which the inputter is installed will be described will be described with reference to FIGS. 1 to 10.

Figure 1:
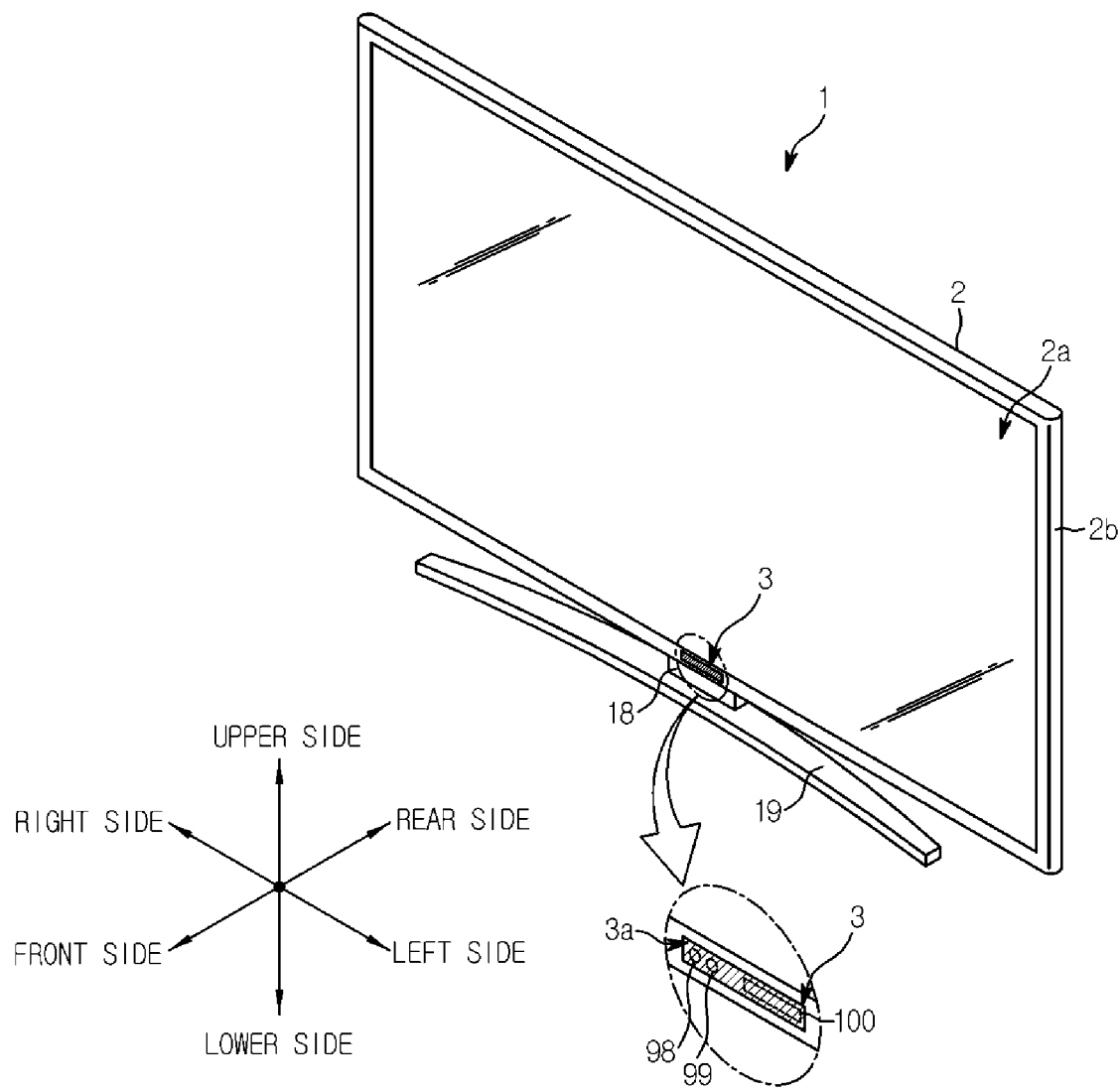
FIG. 1 is a perspective view of an electronic apparatus according to one embodiment of the present disclosure.

FIG. 1 is a perspective view of an electronic apparatus according to one embodiment of the present disclosure Referring to FIG. 1, an electronic apparatus 1 may include a body 2 in which various components for performing a function of the electronic apparatus 1, and a user interface 3 installed on the body 2.

The electronic apparatus 1 represents an apparatus configured to start its operation or perform a variety of operations according to a user manipulation on the user interface 3. For example, the electronic apparatus 1 may include home appliances, computer devices, a variety of portable terminals, wearable computers, electric devices, and a variety of mechanical devices. The home appliance may include display apparatuses, refrigerators, washing machines, vacuum cleaners, or robot cleaners. The display apparatus may include a television or a monitor device. The portable terminal devices may include a cell phone, a smart phone, a tablet PC, a laptop computer, a portable game machine, a navigation device, a personal digital assistant (PDA), or other devices that can be carried by the user. The wearable computers may include smart glasses, a smart band, or a smart watch.

Hereinafter for convenience of description, a display apparatus will be described as an example of the electronic apparatus 1, but is not limited thereto. As mentioned above, various apparatuses will be employed as an example of the electronic apparatus 1.

The body 2 is provided to perform various functions of the electronic apparatus 1. For example, when the electronic apparatus 1 is a display apparatus, the body 2 may be configured to output images and/or sounds.

The body 2 may include a display 2a and an outer frame 2b to which the display 2a is fixed and in which a variety of components is embedded.

The display 2a may be implemented with a variety of display panels such as a liquid crystal display (LCD), a light emitting diode (LED) display panel, an organic light emitting diode (OLED) display panel, or an active-matrix organic light emitting diode) display panel.

Inside the outer frame 2b, various components needed for the operation of the body 2, such as a semiconductor chip, a substrate, various circuit components, and/or a speaker may be embedded. A controller 200 (refer to FIG. 2) or a storage 210 (refer to FIG. 2) may be implemented with the semiconductor chip, the substrate, various circuit components embedded inside the outer frame 2b. In the outer frame 2b, a support may be provided so that the electronic apparatus 1 can be installed at a predetermined position. For example, the support may include a stand or a wall-mounted bracket.

The user interface 3 may be provided on one outer surface of the outer frame 2b. The user interface 3 may be provided on the front surface of the outer frame 2b. In this case, as shown in FIG. 1, the user interface 3 may be provided on a front lower bezel of the outer frame 2b. However, an installation position of the user interface 3 is not limited thereto. Therefore, the user interface 3 may be installed on a lateral surface or a rear surface of the outer frame 2b, or alternatively installed on a front upper end or a lateral end of the outer frame 2b.

The user interface 3 may include at least one of an output device 98 and 99 providing a variety of information of the electronic apparatus 1 to a user, and an inputter 100 receiving various commands from a user. Depending on embodiments, at least one of the output device 98 and 99 and the inputter 100 of the user interface 3 may be integrally formed with the electronic apparatus 1 or separately formed and then mounted to a part of the electronic apparatus 1, such as the outer frame 2b.

The output device 98 and 99 is configured to display an operation state of the electronic apparatus 1 or output the operation state as a sound under a control of the controller 200. For example, the output device 98 and 99 may be implemented with an illuminator configured to emit light such as a light emitting diode or a halogen lamp or implemented with a device such as a speaker.

The inputter 100 may receive various commands from a user according to a user manipulation. For example, the inputter 100 may detect a user touch manipulation, a user motion, or electromagnetic waves, which is generated in a remote controller (not shown) by a user manipulation, and output an electrical signal based on the detected result. Therefore, the inputter 100 may allow the electronic apparatus 1 to receive various commands related to the operation of the electronic apparatus 1, from the user. The various commands related to the operation of the electronic apparatus 1 may include an operation start command for starting the operation of the electronic apparatus 1, a power supply command for supplying power to each component of the electronic apparatus 1, a switch command for switching a ready state into an operation state, and/or an operation change command for changing a channel or regulating a volume of a sound. In this case, the inputter 100 may be configured to receive all of these commands or one or two of the commands.

The user interface 3 may include an outer cover 3a configured to protect the output device 98 and 99 and/or the inputter 100. The output device 98 and 99 and/or the inputter 100 may be shielded by the outer cover 3a. The outer cover 3a may be implemented with a film or a panel formed of a transparent material or a translucent material. In addition, the outer cover 3a is configured to allow the inputter 100 to detect a user touch or motion.

Figure 2:
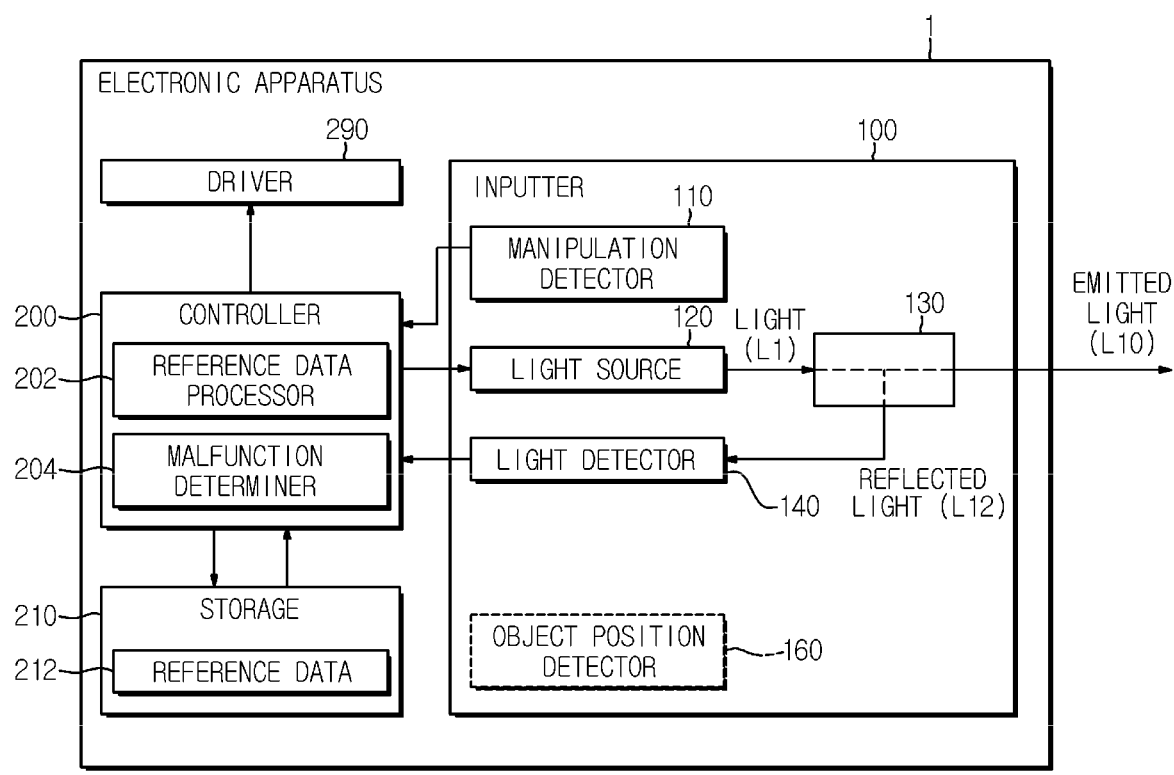
FIG. 2 is a control block diagram of the electronic apparatus according to one embodiment of the present disclosure.

FIG. 2 is a control block diagram of the electronic apparatus according to one embodiment of the present disclosure Referring to FIG. 2, the electronic apparatus 1 according to one embodiment, may include the inputter 100, the controller 200 and the storage 210, and further include a driver 290 depending on embodiments.

Referring to FIG. 2, the inputter 100 may include a manipulation detector 110 configured to detect a user manipulation, a light source 120 configured to emit light (L1) according to an external control or a predetermined setting, and a light detector 140 configured to detect light (L12) that is a part of the light (L1) emitted from the light source 120. In addition, depending on embodiments, the inputter 100 may further include an inputter cover 130 configured to transmit light (L10) that is a part of the light (L1) emitted from the light source 120 and reflect light (L12) that is other part of the light (L1) emitted from the light source 120.

Figure 9:
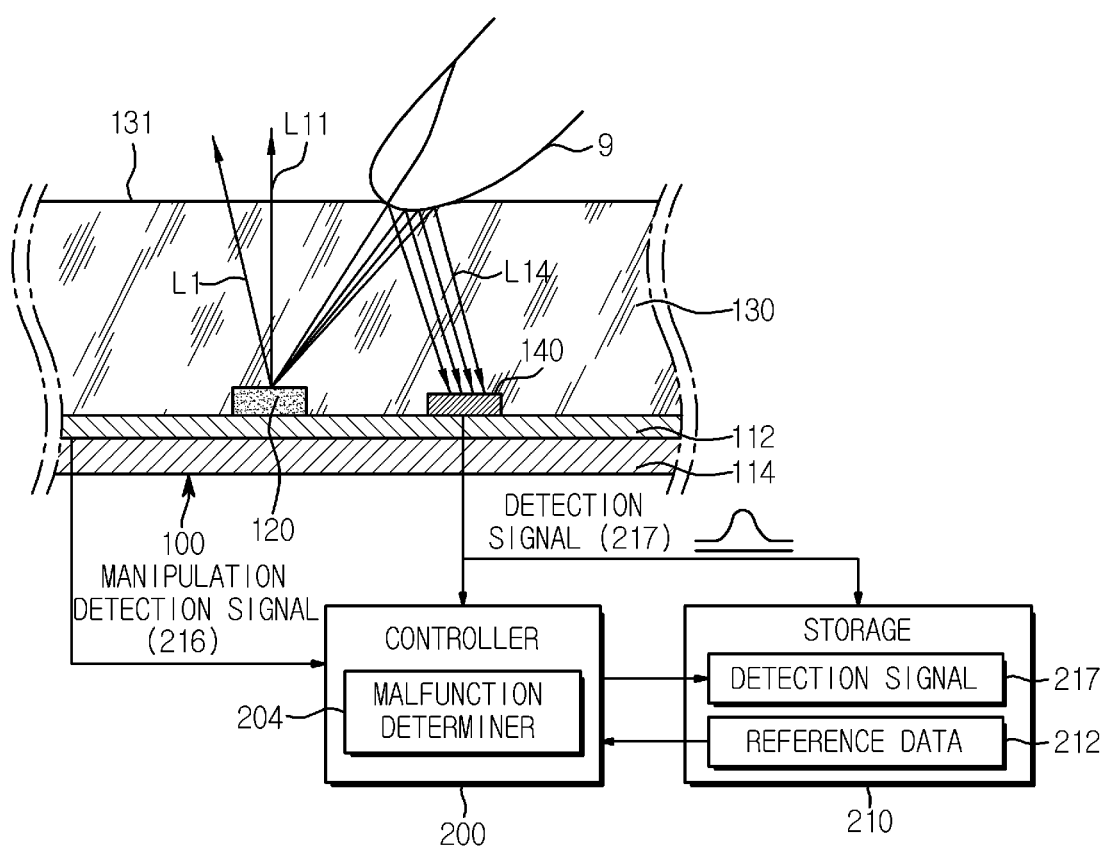
FIG. 9 is a first view showing a process of identifying whether a manipulation detector malfunctions.
Figure 10:
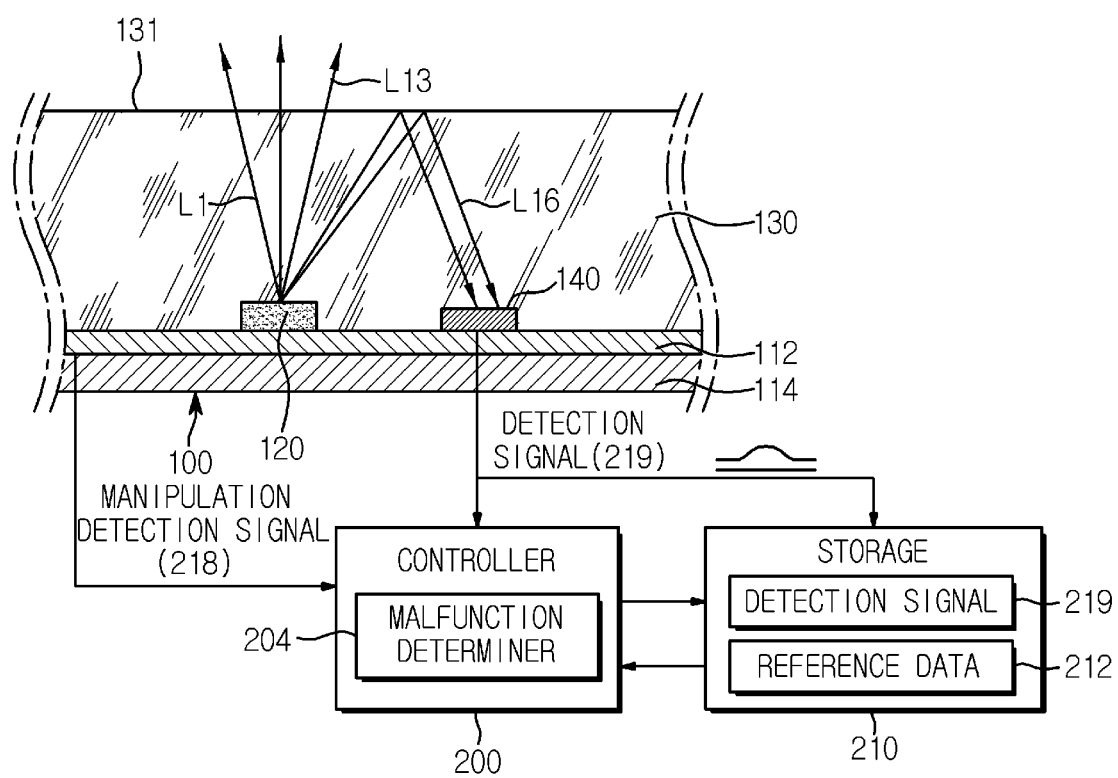
FIG. 10 is a second view showing a process of identifying whether the manipulation detector malfunctions.

The manipulation detector 110 is configured to detect the user manipulation and output an electrical signal corresponding to the detected manipulation that is a manipulation detection signal 216 (refer to FIG. 9) and 218 (refer to FIG. 10). The manipulation detection signal output from the manipulation detector 110 may be transmitted to at least one of the light source 120 or the controller 200 through a circuit or a wire. For example, when a user presses or touches the inputter 100, the manipulation detector 110 may output a manipulation detection signal corresponding to the user pressure or touch manipulation, the output manipulation detection signal may be transmitted to the controller 200 through the circuit or the wire, and the controller 200 may receive the manipulation detection signal transmitted from the inputter 100 and analyze the received manipulation detection signal, and transmit a control signal corresponding to the manipulation detection signal, to the inputter 100, the storage 210 and/or the driver 290. Alternatively, the manipulation detection signal output from the manipulation detector 110 may be transmitted to the light source 120, and the light source 120 may start an emission of the light (L1) in response to the reception of the manipulation detection signal.

Figure 3:
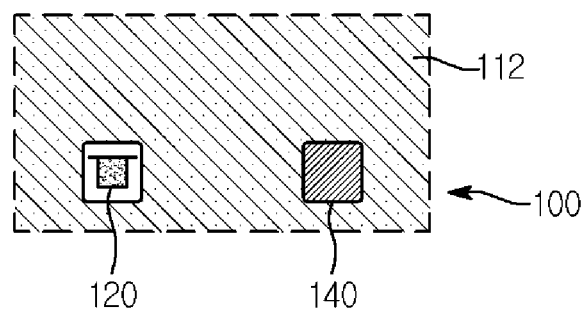
FIG. 3 is a plan view of an inputter according to one embodiment of the present disclosure.
Figure 4:
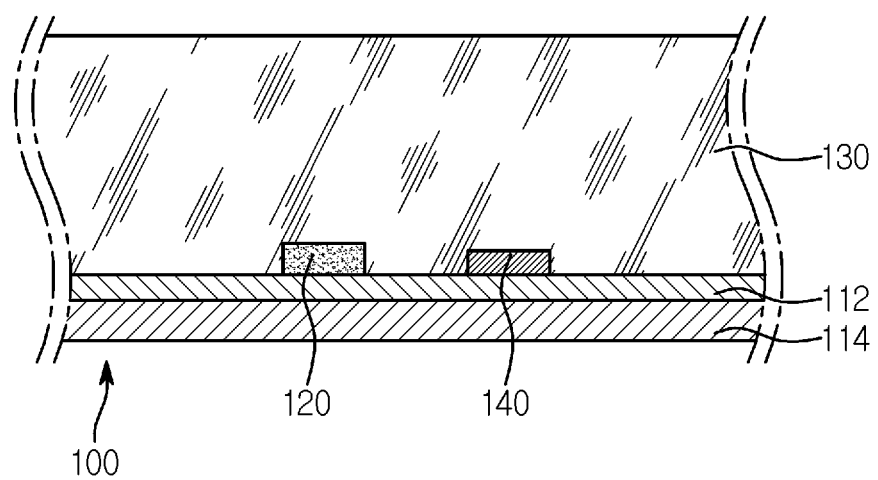
FIG. 4 is side view of the inputter according to one embodiment of the present disclosure.

FIG. 3 is a plan view of an inputter according to one embodiment of the present disclosure, and FIG. 4 is side view of the inputter according to one embodiment of the present disclosure.

According to one embodiment, the manipulation detector 110 may be implemented using a touch sensitive panel 112 configured to detect a user touch manipulation, as shown in FIGS. 3 and 4. The touch sensitive panel 112 is seated on a substrate 114, and detects the user touch manipulation applied through the inputter cover 130. The touch sensitive panel 112 may be implemented using at least one of a resistive touch panel, a capacitive touch panel, an infrared touch panel, and an ultrasound touch panel. For example, in a state in which the touch sensitive panel 112 is implemented with the resistive touch panel, when a predetermined magnitude of force is applied to an outer surface of the inputter cover 130 by using a touch tool such as the user finger or a touch pen, the force applied to the inputter cover 130 may be transmitted to the touch sensitive panel 112, and the touch sensitive panel 112 may detect the applied force and output an electrical signal corresponding to the applied force, thereby receiving a command according to the user manipulation. Alternatively, in a state in which the touch sensitive panel 112 is implemented with the capacitive touch panel, when a user inputs a touch manipulation to the outer surface of the inputter cover 130 by using an object having the conductivity such as the finger, the touch sensitive panel 112 may detect the user touch manipulation by using a capacitive response generated in the inputter cover 130, and output a signal.

The substrate 114 on which the touch sensitive panel 112 is mounted may be a part of a printed circuit board assembly built in the electronic apparatus 1 for controlling various operations of the electronic apparatus 1. Alternatively, the substrate 114 may be separately manufactured from the printed circuit board assembly. The substrate 114 may be installed at various positions of the electronic apparatus 1. For example, the substrate 114 may be installed on a rear surface or a side surface of the display panel of the electronic apparatus 1. In this case, the substrate 114 is provided on one side of the outside of the outer frame 2b.

Figure 5:
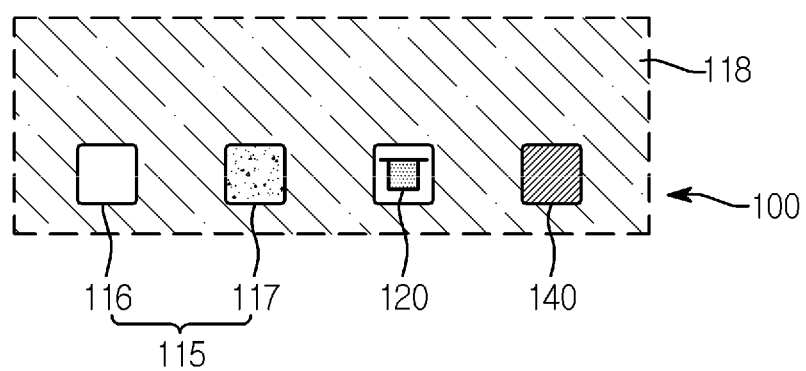
FIG. 5 is a plan view of an inputter according to another embodiment of the present disclosure.
Figure 6:
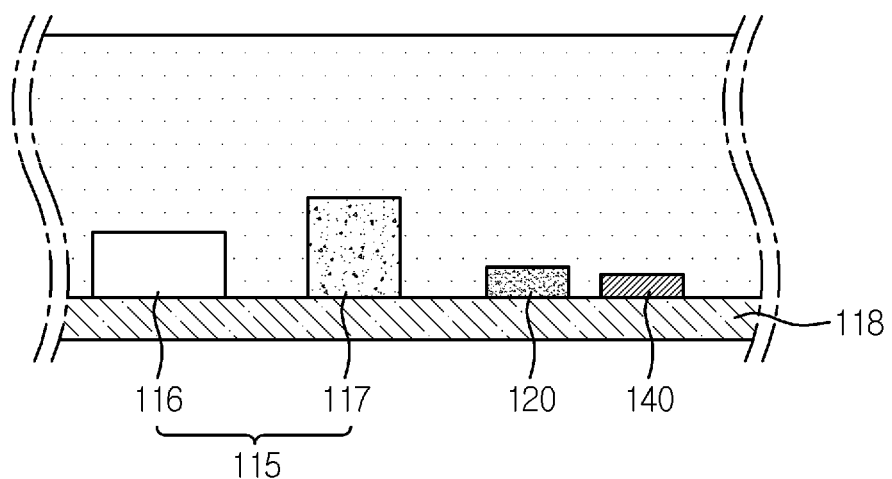
FIG. 6 is a side view of the inputter according to another embodiment of the present disclosure.

FIG. 5 is a plan view of an inputter according to another embodiment of the present disclosure, and FIG. 6 is a side view of the inputter according to another embodiment of the present disclosure.

According to another embodiment, a manipulation detector 110 may be implemented using an infrared sensor 115 configured to detect a user manipulation by using infrared rays, as illustrated in FIGS. 5 and 6.

According to one embodiment, the infrared sensor 115 may include an infrared ray transmitter 116 emitting infrared rays and an infrared ray receiver 117 receiving infrared rays that is reflected and returns from an external object. The infrared ray transmitter 116 and the infrared ray receiver 117 may be spaced apart with each certain distance on a substrate 118. In this case, the infrared ray transmitter 116 and the infrared ray receiver 117 may be disposed on the substrate 118 in various ways, according to a designer. For example, on the substrate 118, the infrared ray transmitter 116 and the infrared ray receiver 117 may be arranged in line with the light source 120 or the light detector 140. Alternatively, on the substrate 118, the infrared ray transmitter 116 and the infrared ray receiver 117, and the light source 120 or the light detector 140 may be arranged side by side. In addition, the infrared ray transmitter 116 and the infrared ray receiver 117 may be arranged independently of the position of the light source 120 or the light detector 140.

The infrared rays transmitted from the infrared ray transmitter 116 are directed to the direction of the substrate 118 by being reflected by the user hand or the object that is in contact with the inputter cover 130. The infrared rays transmitted to the direction of the substrate 118 may be received by the infrared ray receiver 117 and the infrared ray receiver 117 may generate and output an electrical signal corresponding to the infrared rays, in response to the received infrared rays. The electrical signal generated by the infrared ray receiver 117 may be transmitted to at least one of the light source 120 and the controller 200.

The substrate 118 on which the infrared sensor 115 is mounted may be separately manufactured from a printed circuit board assembly, or alternatively, the substrate 118 may be a part of the printed circuit board assembly. The substrate 118 may be installed at various positions on the electronic apparatus 1 such as a rear surface or a side surface of the display panel of the electronic apparatus 1. In this case, the substrate 114 may be provided on one surface of the outside of the outer frame 2b.

The light source 120 is configured to emit predetermined light (L1) according to an electrical signal that is applied. In this case, the light source 120 may be configured to emit all or most of the light (L1) to the direction of the inputter cover 130 that is a direction opposite to the substrate 114 and 118. The predetermined light (L1) may include visible light, infrared light or ultraviolet light and the visible light, and the visible light may include light in at least one color among various colors such as white or red.

The light source 120 may emit the light (L1) based on the electrical signal transmitted from the controller 200, or emit the light (L1) based on the electrical signal output from the manipulation detector 110. For example, the controller 200 may generate a control signal related to a lighting operation of the light source 120 based on the manipulation detection signal transmitted from the manipulation detector 110, and transmit the control signal to the light source 120. Therefore, the light source 120 may emit the light (L1) in response to the control signal that is received. Alternatively, the electrical signal output from the manipulation detector 110 may be directly or indirectly transmitted to the light source 120, and the light source 120 may emit the light (L1) in response to the electrical signal output from the manipulation detector 110.

According to one embodiment, the light source 120 may be disposed on one region of the touch sensitive panel 112, as illustrated in FIGS. 3 and 4. In this case, the light source 120 may disposed and fixed on an appropriate region of one side of the touch sensitive panel 112 so not to interfere the user touch manipulation. FIGS. 3 and 4 illustrate that a single light source 120 is installed on the touch sensitive panel 112, but is not limited thereto. Depending on embodiments, a plurality of light sources 120 may be provided on the touch sensitive panel 112.

In addition, according to another embodiment, the light source 120 may be disposed directly on the substrate 118, as illustrated in FIGS. 5 and 6. In this case, the light source 120 may be spaced apart from the infrared ray transmitter 116 and the infrared ray receiver 117 by a predetermined distance.

For example, the light source 120 may be implemented using an incandescent lamp, a halogen lamp, a fluorescent lamp, a sodium lamp, a mercury lamp, a fluorescent mercury lamp, a xenon lamp, an arc lamp, a neon tube lamp, an EL lamp, or a light emitting diode lamp. In addition, various light emitting means that can be considered by a designer may be employed as the light source 120.

The part (L12) of the light (L1) emitted from the light source 120 may be reflected by a reflector. The reflector may include the outer cover 3a of the user interface 3, the inputter cover 130, the human's hand 9 (refer to FIG. 9) or various devices that are touched to the inputter 100 to manipulate the manipulation detector 110, such as a touch pen. When the reflector is the inputter cover 130, the light (L10) that is a part of the light (L1) emitted from the light source 120 may pass through the inputter cover 130 and then emitted to the outside of the inputter 100, and the light (L12) that is other part of the light (L1) emitted from the light source 120 may be reflected by the outer cover 3a, one surface in contact with the outside of the inputter cover 130, or various particles inside the inputter cover 130.

The light detector 140 is configured to detect the light (L12) that is reflected by the outer cover 3a or the inputter cover 130 and then transmitted to the direction of the substrate 114 and 118, among the light (L1) emitted from the light source 120. As illustrated in FIGS. 3 and 4, the light detector 140 may be installed on one region of the touch sensitive panel 112 or as illustrated in FIGS. 5 and 6, the light detector 140 may be directly installed on the substrate 118.

The light detector 140 may be installed around the light source 120 to appropriately detect the reflected light (L12). In this case, the light detector 140 may be installed on one point of the substrate 118 or the touch sensitive panel 112 while the light detector 140 is spaced apart from the light source 120 by a predetermined distance. FIGS. 4 to 7 illustrate that one single light detector 140 is installed on one side of the light source 120, but the number or the arrangement of the light detector 140 is not limited thereto. For example, a plurality of light detectors 140 may be installed around the inputter cover 130 while surrounding the light source 120.

Depending on embodiments, the light detector 140 may be implemented using a photomultiplier tube, a photodiode, and/or a photo transducer. In addition, the light detector 140 may be implemented using various tools capable of detecting light.

The inputter cover 130 is installed on the touch sensitive panel 112 or the substrate 118. In this case, the inputter cover 130 may be configured to protect components such as the touch sensitive panel 112, the substrate 114 and 118, the light source 120, and the light detector 140.

The inputter cover 130 may be configured to allow the light (L1) emitted from the light source 120 to propagate and configured to allow the part (L12) of the propagating light (L1) to be reflected inside the inputter cover 130 and then propagate to the direction of the substrate 114 and 118. In this case, the part of light (L12) may be reflected by an interface between the inputter cover 130 and the outside, or reflected by molecules scattered inside a material forming the inputter cover 130. Other part light (L10) of the light (L1) propagating in the inputter cover 130 may pass through the inputter cover 130 and emitted to the outside.

The inputter cover 130 may be implemented using various types of transparent or translucent materials. For example, the inputter cover 130 may be formed of a synthetic resin such as an epoxy resin or glass. For example, the inputter cover 130 may be a cover glass. The inputter cover 130 may be separately manufactured and then installed on the touch sensitive panel 112 or the substrate 118. Alternatively, the inputter cover 130 may be installed on the touch sensitive panel 112 or the substrate 118 by being applied on the touch sensitive panel 112 or the substrate 118 and then cured.

Figure 7:
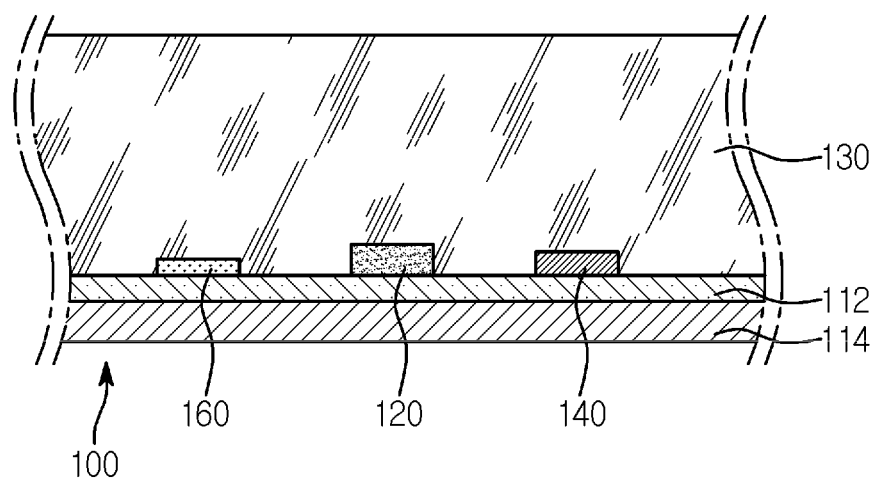
FIG. 7 is a side view of an inputter according to still another embodiment of the present disclosure.

FIG. 7 is a side view of an inputter according to still another embodiment of the present disclosure.

Referring to FIG. 7, an inputter 100 may further include an object position detector 160, as well as the above mentioned manipulation detector 110, light source 120, inputter cover 130 and light detector 140.

The object position detector 160 is configured to identify the presence of objects in front or behind the inputter 100, and configured to measure a distance between an object and the inputter 100. The object position detector 160 may irradiate an electromagnetic wave or an ultrasonic wave to a front or side object, receive electromagnetic waves or ultrasonic waves reflected from the front object, and output a signal corresponding to the received electromagnetic waves or ultrasonic waves. The electromagnetic wave includes infrared light or laser light.

More particularly, when the controller 200 generates a control signal at a predetermined time or an arbitrary time and transmits the control signal to the object position detector 160, the object position detector 160 is operated in response to the control signal of the controller 200 so as to irradiate electromagnetic waves or ultrasonic waves to an object in front. Upon receiving electromagnetic waves or ultrasonic waves, the object position detector 160 outputs an electrical signal corresponding to the received electromagnetic waves or ultrasonic waves. The output electrical signal may be transmitted to the controller 200. When receiving the electrical signal, the controller 200 identifies a point of time in which the object position detector 160 receives the electromagnetic waves or ultrasonic waves, based on the received electrical signal. The controller 200 calculates and acquires a distance between the inputter 100 and the object based on a point of time when the object position detector 160 transmits electromagnetic waves or ultrasonic waves and a point of time when the object position detector 160 receives the electromagnetic waves or ultrasonic waves. According to one embodiment, the controller 200 may allow reference data to be corrected based on the calculated distance between the inputter 100 and the object.

In the absence of the user's touch, an amount of light or an intensity of light (L12) that is received by the light detector 140 when various objects such as a set-top box or a flowerpot is present in front or side of the inputter 100, may be more increased or more decreased than when the object is not present. The controller 200 may acquire reference data 212 based on the amount of light (L12) that is received by the light detector 140 in the absence of the user's touch to the inputter 100. Therefore, when the object is adjacent to the inputter 100, the reference data 212 may be acquired differently from the absence of the object. The controller 200 may acquire the reference data 212 based on the amount of light or the intensity of light that is adjusted based on the distance between the inputter 100 and the object, or the controller 200 may acquire new reference data 212 by correcting the previous reference data 212 by applying the distance between the inputter 100 and the object to the acquired reference data 212.

Depending on embodiments, the object position detector 160 may be installed on the manipulation detector 110 such as the touch sensitive panel 112 or the substrate 114 and 118.

The controller 200 is configured to control the operation of the inputter 100. Depending on embodiments, the controller 200 may control the overall operation of the electronic apparatus 1, or alternatively, the controller 200 may control an operation of the driver 290, as illustrated in FIG. 2.

The controller 200 may be a processor implemented using at least one semiconductor chip, circuit, and related components. For example, the processor may include a microcontroller unit (MCU) or a microprocessor unit (MPU).

As illustrated in FIG. 2, the controller 200 may include a reference data processor 202 configured to acquire the reference data 212, and a malfunction determiner 204 configured to identify whether the inputter 100 is operated normally or not, based on the reference data 212. The reference data processor 202 and the malfunction determiner 204 may be physically separated from each other or logically separated from each other. When the reference data processor 202 and the malfunction determiner 204 are physically separated from each other, the reference data processor 202 and the malfunction determiner 204 may be implemented with different MCU or MPU. A detail operation of the reference data processor 202 and the malfunction determiner 204 will be described later.

The storage 210 may temporarily or non-temporarily store the reference data 212. The storage 210 may transmit the reference data 212 to the controller 200 in response to a call of the controller 200 so as to allow the malfunction determiner 204 of the controller 200 to identify whether the malfunction occurs based on the reference data 212. In addition, the storage 210 may temporarily or non-temporarily store at least one detection signal 214 (refer to FIG. 8), 217 (refer to FIG. 9), and 219 (refer to FIG. 10), output from the light detector 140, and transmit the stored detection signal 214, 217 and 219 to the controller 200 in response to a call of the controller 200. The storage 210 may store various data or programs needed for the operation of the electronic apparatus 1, as well as the reference data 212 and the detection signal 214, 217 and 219.

The storage 210 may be implemented using at least one of a magnetic drum storage device, a magnetic disk storage device, and a semiconductor storage device, and the semiconductor storage device may include a nonvolatile memory or a volatile memory.

FIG. 2 illustrates one embodiment in which the controller 200, the storage 210 and the inputter 100 are separately provided, but at least one of the controller 200 and the storage 210 may be provided in the inputter 100. In this case, the semiconductor chip and the related circuit provided on the substrate 114 and 118 of the inputter 100 may perform at least one function of the controller 200 and the storage 210.

The driver 290 performs various functions and operations that the electronic apparatus 1 can provide to a user. For example, when the electronic apparatus 1 is a display apparatus, the driver 290 may include a display 2a implemented using a display panel. When the electronic apparatus 1 is a refrigerator, the driver 290 may include components for cooling a storage space, such as a condenser, a compressor, an expansion valve and a heat exchanger. When the electronic apparatus 1 is a cleaner, the driver 290 may include various components for sucking foreign substances. In addition, the driver 290 may be implemented by having various components according to type of the electronic apparatus 1.

Hereinafter the operation of the reference data processor 202 and the malfunction determiner 204 will be described in details.

Figure 8:
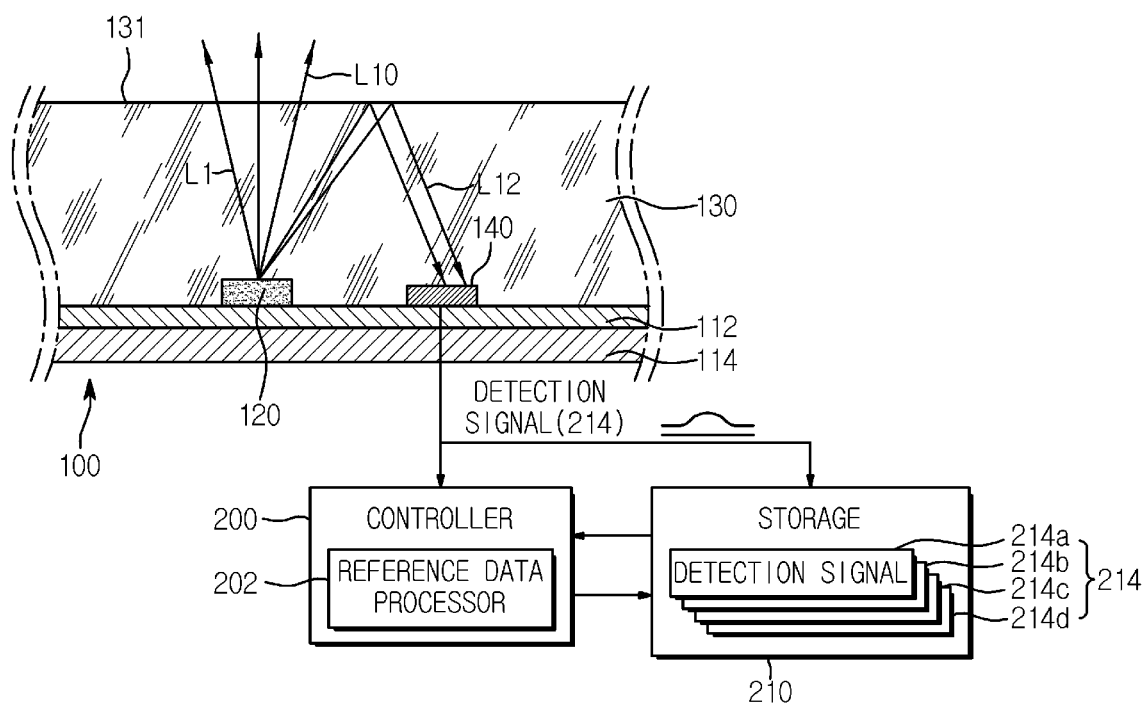
FIG. 8 is a view showing a process of acquiring reference data according to one embodiment of the present disclosure.

FIG. 8 is a view showing a process of acquiring reference data according to one embodiment of the present disclosure.

The reference data processor 202 may acquire the reference data 212 based on the detection signal 214 transmitted from the light detector 140.

Particularly, the reference data processor 202 may transmit a control signal to the light source 120 according to a user's manual manipulation or a predetermined setting, and the light source 120 may emit the light (L1) according to the control signal. The predetermined setting may include a point of time when the light source 120 emits the light (L1). The time when the light source 120 emits the light (L1) may be pre-defined by a user or a designer or may be a point of time that is arbitrarily selected by the reference data processor 202. In addition, the predetermined setting may include a period in which the light source 120 emits the light (L1). For example, when a period in which the light source 120 emits the light (L1) is one hour, the reference data processor 202 may transmit a control signal to the light source 120 every time and the light source 120 may emit the light (L1) every time in response to the control signal.

When the light (L1) is emitted from the light source 120, a part (L10) of the light may pass through the inputter cover 130 and then be emitted to the outside, and other part (L12) of light may be reflected by the outer surface or the inside of the inputter cover 130 and then transmitted to the light detector 140.

The light detector 140 may output the detection signal 214 corresponding to the received light (L12), and directly transmit the output detection signal 214 to the controller 200 or transmit the output detection signal 214 to the storage 210. In this case, an intensity of the detection signal 214 output from the light detector 140 may correspond to the amount or the intensity of the incident reflected light (L12). As needed, before being transmitted to the storage 210, the signal output from the light detector 140 may be converted into a digital signal by an analogue-to-digital converter and/or amplified by an amplifier.

According to one embodiment, the light source 120 may emit light (L1) by a plurality of times and thus the light detector 140 may output the number of detection signals 214a to 214d corresponding to the number of emission time of the light (L1). The plurality of detection signals 214a to 214d may be stored in the storage 210 independently of each other.

The reference data processor 202 may acquire the reference data 212 based on the detection signal 214 that is transmitted from the light detector 140 or stored in the storage 210. Particularly, the reference data processor 202 may acquire the reference data 212 by corresponding to the amount of light or the intensity of light corresponding to the detection signal 214. The reference data processor 202 may define the amount of light or the intensity of light as the reference data 212 without a change. Accordingly, as the amount of light or the intensity of light is increased, the reference data 212 may be defined as a relatively large value, and as the amount of light or the intensity of light is reduced, the reference data 212 may be defined as a relatively small value. In addition, the reference data processor 202 may define the reference data 212 by partially correcting the amount of light or the intensity of light by adding a weight to the amount of light or the intensity of light. In this case, the weight may be to apply the detection result of the object position detector 160. Depending on embodiments, when acquiring the reference data 212, the reference data processor 202 may define the amount of light or the intensity of light contained in a predetermined range, as the same value of reference data.

when the plurality of the detection signals 214a to 214d is acquired, the reference data processor 202 may acquire the reference data 212 by using methods such as calculating an arithmetic mean, a harmonic mean, or a geometric mean of the amount of light or the intensity of light corresponding to each of the plurality of the detection signals 214a to 214d, or acquiring a median value of the amount of light or the intensity of light corresponding to each of the plurality of the detection signals 214a to 214d.

In a state in which a predetermined reference data 212 is provided, when new reference data 212 is acquired by using the detection signal 214, the reference data processor 202 may discard the reference data that is previously acquired, and set the new reference data 212 to reference data that is used to identify the malfunction. When the light source 120 periodically emits the light (L1), the reference data 212 may be periodically updated.

Further, the reference data processor 202 may acquire the reference data 212 based on the detection signal 214 by using various methods that is considered by a designer.

The reference data 212 acquired by the reference data processor 202 may be transmitted to the storage 210, and the storage 210 may temporarily or non-temporarily store the reference data 212.

FIG. 9 is a first view showing a process of identifying whether a manipulation detector malfunctions.

The malfunction determiner 204 may identify whether the malfunction of the manipulation detector 112 and 115 occurs based on the reference data 212 acquired by the reference data processor 202 and the detection signal 217 transmitted from the light detector 140.

Hereinafter a malfunction identification operation of the malfunction determiner 204 will be described as an example in which the manipulation detector 110 is the touch sensitive panel 112. However, operations and functions to be described may be applicable to a case in which the manipulation detector 110 is the infrared sensor 115, with modification or without modification.

As illustrated in FIG. 9, when the touch sensitive panel 112 outputs the manipulation detection signal 216 in response to the touch manipulation, the light source 120 may emit the light (L1) according to the control of the controller 200 or the manipulation detection signal 216. While a part (L11) of the light (L1) emitted from the light source 120 propagates inside the inputter cover 130, the part (L11) may be emitted to the outside, and other part (L14) may be reflected to the direction of the substrate 114 by a reflector and then incident to the light detector 140.

When a touch tool 9 such as the fingertip, is in contact with the outer surface of the inputter cover 130 as illustrated in FIG. 9, reflectance of the light (L1) emitted from the light source 120 may be increased by the touch tool 9 and thus a relatively great amount of light (L14) may be incident to the light detector 140 in comparison with the case in which the touch tool 9 is not in contact with the outer surface of the inputter cover 130. Accordingly, the light detector 140 may output a detection signal 217 corresponding to the relatively great amount of light, and in this case, an intensity of the detection signal 217 may be greater than the detection signal 214 at the acquirement of the reference data 212. The output detection signal 217 may be directly transmitted to the controller 200, or stored in the storage 210 and then transmitted to the controller 200.

The malfunction determiner 204 of the controller 200 may call the reference data 212 and compare the reference data 212 with the detection signal 217. According to one embodiment, the malfunction determiner 204 identifies that the manipulation detection signal 216 is output by the user manipulation when a difference between the reference data 212 and the detection signal 217 exceeds a predetermined comparison value (C), as illustrated in an upper end portion of equation 1 below. That is, when the difference between the reference data 212 and the detection signal 217 exceeds the comparison value, the malfunction determiner 204 identifies that the touch sensitive panel 112 is appropriately operated.

$$D = \begin{cases} \text{NORMAL} & \text{if } |Vr - Vc| \geq C \\ \text{ERROR} & \text{if } |Vr - Vc| < C \end{cases} \quad \text{[Equation 1]}$$

In the equation 1, D represents a determination result, Vr represents a reference data value, Vc represents a detection signal value, and C represents a comparison value. In addition, the equation 1 is defined such that it is identified to be normal when the reference data Vr and the detection signal Vc are the same. Alternatively, the equation 1 may be defined such that it is identified that the malfunction occurs when the reference data Vr and the detection signal Vc are the same.

When it is identified that the touch sensitive panel 112 is operated normally, based on the comparison result, the controller 200 may generate a control signal corresponding to the manipulation detection signal 216 and transmit the control signal to each component of the electronic apparatus 1 such as the driver 290. For example, according to the manipulation detection signal 216, the controller 200 may transmit the control signal to a power supplier or a switch that connects each component to the power supplier, so as to apply the power to each component of the electronic apparatus 1.

FIG. 10 is a second view showing a process of identifying whether a manipulation detector malfunctions.

As illustrated in FIG. 10, when the touch sensitive panel 112 outputs the manipulation detection signal 216, the light source 120 may output the light (L1) according to the control of the reference data processor 202 of the controller 200 or the manipulation detection signal 216. While the emitted light (L1) propagates inside the inputter cover 130, the emitted light (L1) may be emitted to the outside (L13), or reflected to the direction of the substrate 114 (L16) and then incident to the light detector 140.

As illustrated in FIG. 10, when the touch tool 9 is not present on the outer surface of the inputter cover 130, the light (L1) emitted from the light source 120 generally passes through the inputter cover 130 and then emitted to the outside (L13), and a relatively smaller amount of light (L16) is incident to the light detector 140 in comparison with a case in which the touch tool 9 is present on the outer surface of the inputter cover 130. Accordingly, the light detector 140 outputs a detection signal 219 corresponding to the light (L16) that is relatively smaller amount. In this case, since there is little difference between an amount of light or an intensity of light (L16) incident to the light detector 140 and an amount of light or an intensity of light (L12) incident to the light detector 140 upon acquiring the reference data 212, the output detection signal 219 may be substantially the same as the detection signal 214 that is output upon acquiring the reference data 212. The output detection signal 219 may be directly transmitted to the controller 200 or stored in the storage 210 and then transmitted to the controller 200.

The malfunction determiner 204 of the controller 200 calls the pre-stored reference data 212 and compares the reference data 212 with the detection signal 219. In this case, since the detection signal 219 is substantially the same as the detection signal 214 that is output upon acquiring the reference data 212, a difference between the reference data 212 and the detection signal 219 is less than the predetermined comparison value (C). As illustrated in a lower part of the equation 1, the malfunction determiner 204 identifies that, when the difference between the reference data 212 and the detection signal 219 is less than the predetermined comparison value (C), the manipulation detection signal 216 is output because of the malfunction of the touch sensitive panel 112 not because of the user manipulation.

When it is identified that the touch sensitive panel 112 malfunctions, the controller 200 ignores or discards the manipulation detection signal 216. Accordingly, any control single is not transmitted to each component of the electronic apparatus 1 such as the driver 290, and thus each component may not perform an operation corresponding to the control signal despite of the output of the detection signal 219 of the touch sensitive panel 112.

In a state in which the touch sensitive panel 112 employs the capacitive method, the manipulation detection signal 218 may be output from the touch sensitive panel 112 caused by the power noise although the user does not perform a touch manipulation. In a state in which the touch sensitive panel 112 employs the resistive method, the manipulation detection signal 218 may be output from the touch sensitive panel 112 caused by the pressure of the peripheral device or the distortion of the touch sensitive panel 112, although the user does not perform the touch manipulation. As mentioned above, as for identifying whether the touch sensitive panel 112 malfunctions based on the comparison between the detection signal 214 and the detection signal 217 and 219, it may be possible to prevent the electronic apparatus 1 from being operated caused by the malfunction although the touch sensitive panel 112 outputs the manipulation detection signal 218 without the touch manipulation.

Hereinafter a control method of the inputter will be described with reference to FIGS. 11 to 13.

Figure 11:
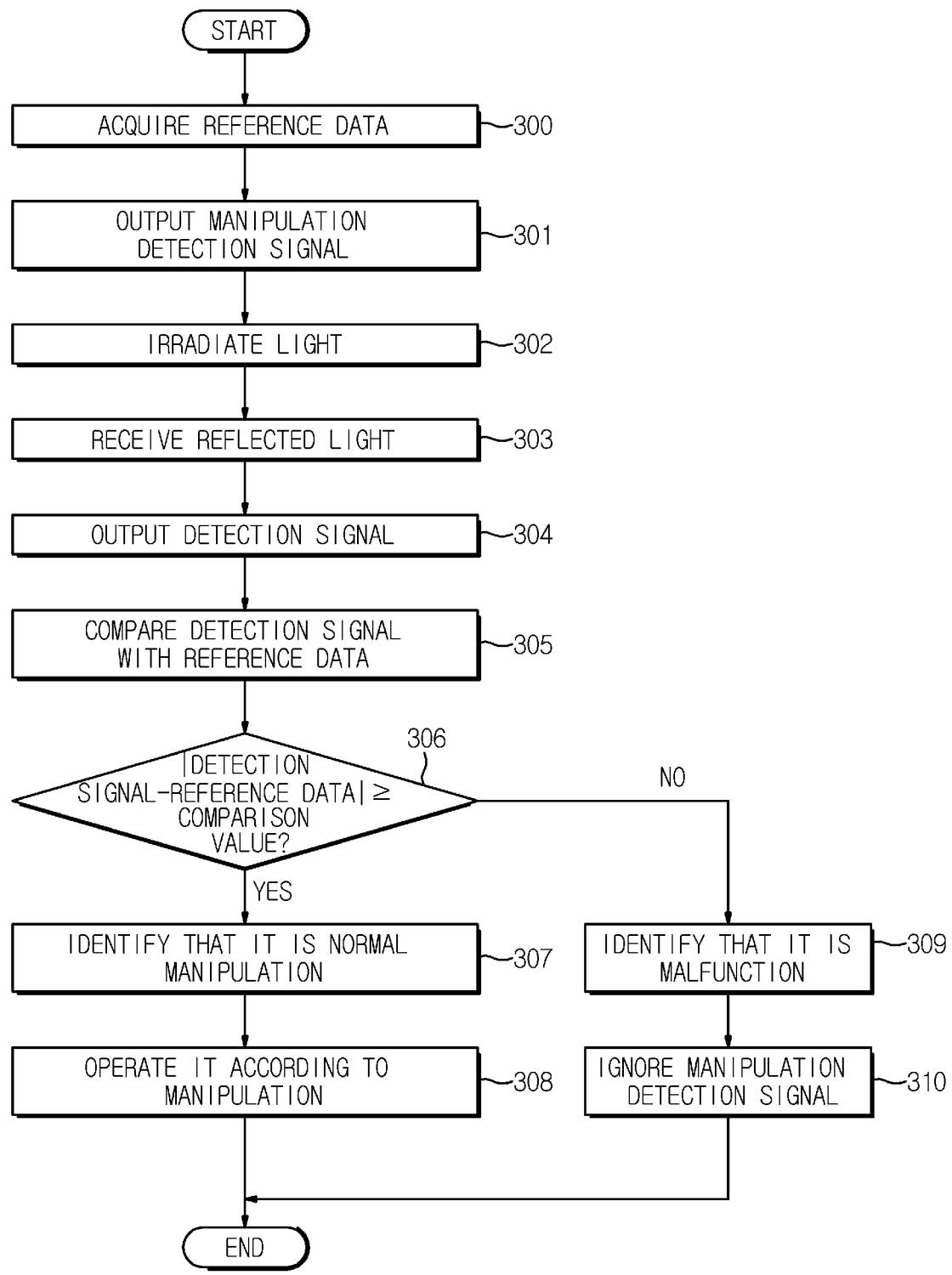
FIG. 11 is a flowchart of a control method of the inputter according to one embodiment of the present disclosure.

FIG. 11 is a flowchart of a control method of an inputter according to one embodiment of the present disclosure.

Referring to FIG. 11, the reference data is acquired by the light source 120 and the light detector 140 provided in the inputter of the electronic apparatus, as mentioned above (300).

When a manipulation detection signal is output from the manipulation detector 110 (301), the light source 120 irradiates light in response to the manipulation detection signal or under the control of the controller 200 (302), and the light detector 140 receives light that is reflected by one surface or the inside of the inputter cover 130 (303) and outputs a detection signal corresponding to the received light (304).

The controller 200 compares the acquired reference data with the detection signal (305).

When the difference between the detection signal and the reference data exceeds the comparison value (Yes in 306), the controller 200 identifies that a user manipulates the inputter and the manipulation detection signal is output caused by the user manipulation (307), and generates a control signal according to the manipulation detection signal and transmits the control signal to components of the electronic apparatus.

Each component of the electronic apparatus is operated in response to the control signal (308). In other words, the electronic apparatus is operated according to the user manipulation.

When it is identified that the difference between the detection signal and the reference data is less than the comparison value, based on the comparison result (No in 306), the controller 200 identifies that a user does not manipulate the inputter and the manipulation detection signal is output caused by the malfunction (309).

Accordingly, the controller 200 ignores or discards the manipulation detection signal output from the inputter 100 and thus the electronic apparatus 1 maintains its previous state or operation (310).

Hereinafter a method for acquiring reference data will be described with reference to various examples.

Figure 12:
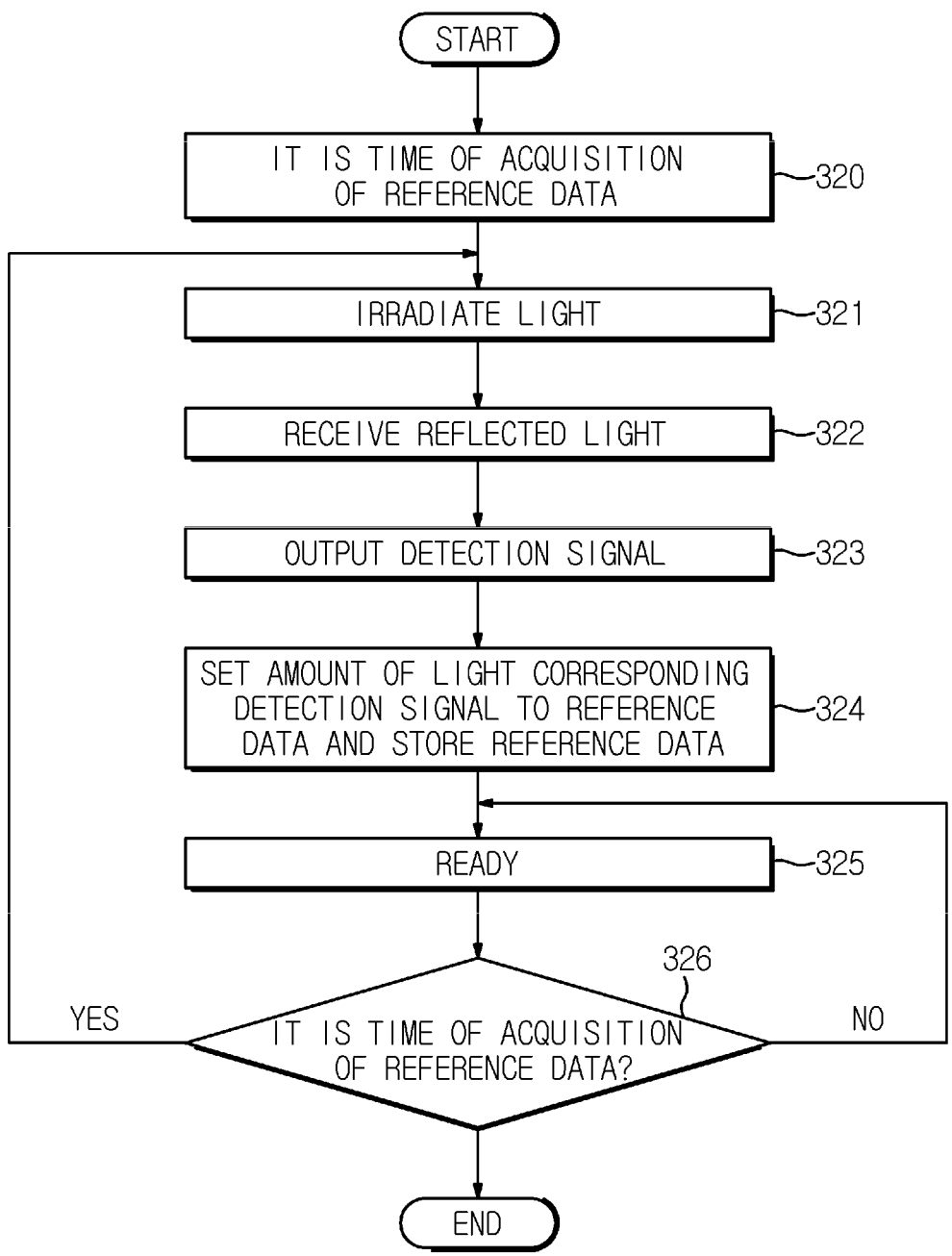
FIG. 12 is a flowchart of a method for acquiring reference data according to one embodiment of the present disclosure.

FIG. 12 is a flowchart of a method for acquiring reference data according to one embodiment of the present disclosure.

As illustrated in FIG. 12, when it is a time of acquisition of the reference data according to a predetermined setting such as a predetermined time or a predetermined period (320), the light source 120 emits light (321), and the light detector 140 receives light that is reflected by one surface or the inside of the inputter cover 130 (322) and outputs a detection signal corresponding to the received light (323).

The controller 200 acquires the reference data based on the output detection signal. For example, the controller 200 may set an amount of light or an intensity of light corresponding to the detection signal, to the reference data without modification or with modification, and the controller 200 may allow the storage 210 to store the reference data (324).

The electronic apparatus 1 is ready until a manipulation detection signal is output from the inputter 100 (301 of FIG. 11) or until it is a time of acquisition of new reference data (325).

When it is the time of acquisition of new reference data (yes in 326), the controller 200 of the electronic apparatus 1 allows the light source 120 to irradiate light by controlling the light source 120 (321), and the controller 200 acquires new reference data based on reflected light that is detected by the light detector 140, and store the new reference data (322 to 324). In this case, the previous reference data may be discarded.

The above mentioned method for acquiring reference data may be continuously performed as long as the power is supplied to the electronic apparatus 1. For example, the method for acquiring reference data may be performed although the electronic apparatus 1 is in a ready state or an operation state (326).

Figure 13:
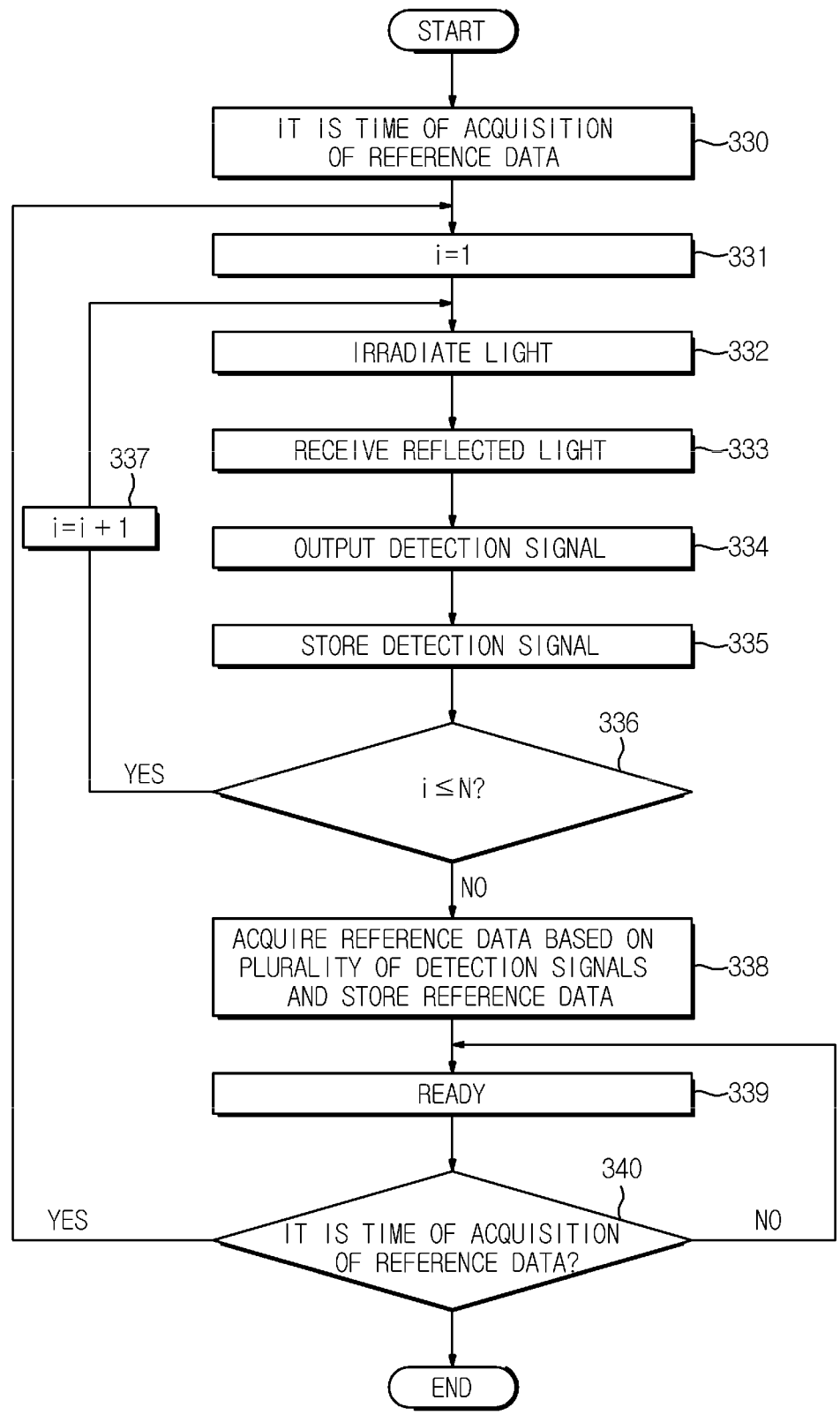
FIG. 13 is a flowchart of a method for acquiring reference data according to another embodiment of the present disclosure.

FIG. 13 is a flowchart of a method for acquiring reference data according to another embodiment of the present disclosure.

As illustrated in FIG. 13, when it is a time of acquisition of the reference data according to a predetermined setting such as a predetermined time or a predetermined period (330), the light source 120 irradiates light (332), and the light detector 140 receives light that is reflected by one surface or the inside of the inputter cover 130 (333) and outputs a detection signal corresponding to the received light (24334). The storage 210 stores the output detection signal in the form of data (335).

Until the number of time reaches a predetermined number of time (N), the irradiation of the light (332), the detection of the light (333), the output of the detection signal (324), and the storage of the detection signal (325) may be repeatedly performed (331, 336 and 337). That is, the inputter 100 or the controller 200 counts the number of times of acquiring detection signal and when the number of times of acquiring detection signal is identical to a predetermined number of times (no in 336), the inputter 100 or the controller 200 terminates the acquisition process of the detection signal (331 to 335).

The controller 200 may acquire the reference data based on the acquired plurality of detection signals (338). For example, the controller may average the amount of light or the intensity of light corresponding to the plurality of detection signals or acquire a median value among them, and set the acquired average or median value, to the reference data.

The electronic apparatus 1 is ready until a manipulation detection signal is output from the inputter 100 (301 of FIG. 11) or until it is a time of acquisition of new reference data (339).

When it is the time of acquisition of new reference data (yes in 340), the controller 200 of the electronic apparatus 1 acquires a plurality of detection signals by corresponding to the time of acquisition of new reference data (331 to 336) and the controller 200 may acquire new reference data by using the acquired plurality of detection signals (338).

The above mentioned method for acquiring reference data may be continuously performed as long as the power is supplied to the electronic apparatus 1.

The above-described control method of the inputter can be applied to the control method of the electronic apparatus without modification or with modification. In this case, the electronic apparatus may include home appliances, computer devices, electric devices, and a variety of mechanical devices or a variety of portable terminals. In addition, the electronic apparatus may include a variety of apparatuses configured to be electrically controlled and configured to allow the above mentioned inputter to be installed thereon. Therefore, the above mentioned control method of the inputter may be applied to a control method of a display apparatus without modification or with modification.

A control method of the inputter according the above-described embodiment may be implemented in the form of a program executed by a variety of computer devices. A processor implementing the above mentioned controller 200 may allow the control method of the inputter or the control method of the display apparatus to be performed by executing the program. The program may include program instructions, data files, and data structures as itself or a combination therewith. The program may be designed or manufactured by using higher level code executed by the computer by using an interpreter, as well as by using a machine code that is produced by a compiler.

Programs for implementing the control method of the above-mentioned inputter may be recorded on a recording medium readable by a computer. The recording medium readable by a computer may include various types of hardware devices capable of storing a particular program executed in response to a call from a computer, e.g. magnetic disk storage media such as a hard disk or a floppy disk, optical media such as a magnetic tape, a compact disc (CD) or a DVD, magneto-optical media such as a floptical disk, and semiconductor memory devices such as ROM, RAM, or flash memory.

Hereinbefore a variety of embodiments of the inputter, the display apparatus to which the inputter is installed, and the control method of the inputter are described, but is not limited thereto. A variety of embodiments which is implementable by those skilled in the art by correcting and modifying based on the above mentioned embodiment may correspond to the above mentioned inputter, the display apparatus to which the inputter is installed, and the control method of the inputter. For example, when the above-mentioned techniques is executed in a different order from the above-mentioned method, and/or the above-mentioned components such as system, structure, device and circuit is coupled or combined in a manner different from the above-mentioned method or is replaced or substituted by other components or equivalents, the same or the similar result as the above-mentioned inputter, the display apparatus to which the inputter is installed, and the control method of the inputter may be achieved and those may correspond to an example of the above-mentioned inputter, the display apparatus to which the inputter is installed, and the control method of the inputter.

INDUSTRIAL APPLICABILITY

The above-described inputter, the display apparatus to which the inputter is installed, and the control method of the inputter can be used in various fields such as in-house or industrial field, and thus there is industrial applicability.

The invention claimed is:

1. A control method of an inputter comprising:
obtaining, by at least one of the inputter and an electronic apparatus connected to the inputter, reference data;
outputting, by a manipulation detector of the inputter, a manipulation detection signal;
irradiating, by a light source of the inputter, first light;
detecting, by a light detector of the inputter, first reflected light that is incident to the light detector among the irradiated first light;
identifying a position of an external object, by using an object detector, and correcting the reference data based on the position of the external object that is identified;
comparing, by at least one of the inputter and the electronic apparatus, the detection result of the first reflected light with the corrected reference data; and
identifying whether the manipulation detector outputting the manipulation signal malfunctions, based on a result of the comparing,
wherein the correcting the reference data is based on an obtained distance between the inputter and the external object, obtained using the object detector.

2. The control method according to claim 1, wherein the obtainment of the reference data comprises an operation in which the light source irradiates a second light, an operation in which the light detector detects a second reflected light caused by the irradiated second light, and an operation in which the reference data is obtained based on a detection result of the second reflected light.

3. The control method according to claim 2, wherein the operation in which the light source irradiates the second light in response to the obtainment of the reference data comprises
an operation in which light source irradiates the second light periodically, and
an operation in which light source irradiates the second light at a predetermined time or an operation in which light source irradiates the second light at an arbitrary time.

4. The control method according to claim 2, wherein the operation in which the light source irradiates the second light comprises an operation in which the light source irradiates light a plurality of times, and
the obtainment of the reference data based on the detection result of the second reflected light comprises obtaining reference data based on a detection result of a plurality of reflected light corresponding to the light irradiated the plurality of times.

5. The control method according to claim 1, wherein the comparison between the detection result of the first reflected light and the corrected reference data and the identification of whether the manipulation detector outputting the manipulation signal malfunctions, based on the result of the comparing, comprises identifying that, when a difference between the detection result of the first reflected light and the corrected reference data is greater than a predetermined comparison value, the manipulation detector is operated normally.

6. The control method according to claim 5, further comprising:
generating a control signal corresponding to the manipulation detection signal, when the manipulation detector is operated normally.

7. The control method according to claim 1, wherein the comparison between the detection result of the first reflected light and the corrected reference data and the identification of whether the manipulation detector outputting the manipulation signal malfunctions, based on the result of the comparing, comprises identifying that, when a difference between the detection result of the first reflected light and the corrected reference data is less than a predetermined comparison value, the manipulation detector malfunctions.

8. The control method according to claim 7, further comprising:
ignoring the manipulation detection signal, when the manipulation detector malfunctions.

9. The control method according to claim 1, wherein the manipulation detector comprises at least one of a touch sensor or an infrared sensor.

10. A display apparatus comprises:
a substrate;
a manipulation detector installed on the substrate and configured to output a manipulation detection signal in response to a user manipulation;
a light source installed on the substrate or the manipulation detector and configured to irradiate light;
a light detector configured to output a detection signal corresponding to a reflected light that is incident among the light irradiated from the light source;
an object detector configured to detect a position of an external object; and
a processor configured to correct the reference data based on the position of the external object that is detected and compare the detection signal corresponding to the reflected light and the corrected reference data, and configured to identify whether the manipulation detector outputting the manipulation signal malfunctions, based on the comparison result, wherein the processor is configured to correct the reference data based on an obtained distance between the display apparatus and the external object, obtained using the object detector.

11. The display apparatus according to claim 10, wherein when it is a time to obtain reference data, the processor controls the light source to irradiate light and obtains the reference data based on a detection signal of the light detector or obtains the reference data by allowing the light source to irradiate light periodically or to irradiate light at a predetermined time or an arbitrary time.

12. The display apparatus according to claim 11, wherein the processor allows the light source to irradiate light by a plurality of times, and obtains the reference data based on a plurality of detections signals corresponding to the light irradiated by the plurality of times.

13. The display apparatus according to claim 10, wherein when a difference between the detection signal of the reflected light and the corrected reference data is greater than a predetermined comparison value, the processor identifies that the manipulation detector is operated normally, or when the difference between the detection signal of the reflected light and the corrected reference data is less than the predetermined comparison value, the processor identifies that the manipulation detector malfunctions.

\* \* \* \* \*